United States Patent
Yoshida et al.

(10) Patent No.: US 10,138,397 B2
(45) Date of Patent: Nov. 27, 2018

(54) SINGLE-CRYSTAL SILICON-CARBIDE SUBSTRATE AND POLISHING SOLUTION

(71) Applicant: ASAHI GLASS COMPANY, LIMITED, Chiyoda-ku (JP)

(72) Inventors: Iori Yoshida, Tokyo (JP); Satoshi Takemiya, Tokyo (JP); Hiroyuki Tomonaga, Tokyo (JP)

(73) Assignee: AGC Inc., Chiyoda-ku (JP)

( * ) Notice: Subject to any disclaimer, the term of this patent is extended or adjusted under 35 U.S.C. 154(b) by 0 days.

(21) Appl. No.: 15/623,540

(22) Filed: Jun. 15, 2017

(65) Prior Publication Data
US 2017/0283987 A1    Oct. 5, 2017

Related U.S. Application Data

(60) Division of application No. 14/246,556, filed on Apr. 7, 2014, now abandoned, which is a continuation of
(Continued)

(30) Foreign Application Priority Data

Oct. 7, 2011   (JP) ................. 2011-222782

(51) Int. Cl.
*C30B 29/36*  (2006.01)
*C30B 25/18*  (2006.01)
(Continued)

(52) U.S. Cl.
CPC .............. *C09G 1/04* (2013.01); *C30B 29/36* (2013.01); *C30B 33/00* (2013.01);
(Continued)

(58) Field of Classification Search
None
See application file for complete search history.

(56) References Cited

U.S. PATENT DOCUMENTS 6,270,573 B1 * 8/2001 Kitabatake .............. C30B 23/02
117/101
9,129,901 B2   9/2015 Yoshida et al.
(Continued)

FOREIGN PATENT DOCUMENTS

CN   101263209 A   9/2008
CN   101346805 A   1/2009
(Continued)

OTHER PUBLICATIONS

Yongguang Wang, et al., "A Review on the CMP of SiC and Sapphire Wafers", Advanced Materials Research, vols. 126-128, 2010, pp. 429-434 and cover letter.
(Continued)

*Primary Examiner* — Shamim Ahmed
(74) *Attorney, Agent, or Firm* — Oblon, McClelland, Maier & Neustadt, L.L.P.

(57) ABSTRACT

The present invention relates to a single-crystal silicon-carbide substrate provided with a principal surface having an atomic step-and-terrace structure containing atomic steps and terraces derived from a crystal structure, in which the atomic step-and-terrace structure has a proportion of an average line roughness of a front edge portion of the atomic step to a height of the atomic step being 20% or less.

15 Claims, 5 Drawing Sheets

Related U.S. Application Data application No. PCT/JP2012/075504, filed on Oct. 2, 2012.

(51) Int. Cl.

| | | |
|---|---|---|
| *C30B 23/02* | (2006.01) | |
| *C09G 1/04* | (2006.01) | |
| *H01L 21/02* | (2006.01) | |
| *C30B 33/00* | (2006.01) | |
| *H01L 29/16* | (2006.01) | |

(52) U.S. Cl.
CPC .... H01L 21/02024 (2013.01); H01L 29/1608 (2013.01); *Y10T 428/24355* (2015.01)

(56) References Cited

U.S. PATENT DOCUMENTS

| | | |
|---|---|---|
| 2003/0012050 A1* | 1/2003 | Iwasaki .............. B82Y 25/00 365/171 |
| 2003/0139069 A1 | 7/2003 | Block |
| 2005/0045852 A1 | 3/2005 | Ameen |
| 2006/0199473 A1 | 9/2006 | Suzuki et al. |
| 2007/0039926 A1 | 2/2007 | Cherian et al. |
| 2007/0147551 A1 | 6/2007 | Mabuchi et al. |
| 2008/0289570 A1 | 11/2008 | Kawahara et al. |
| 2010/0279506 A1 | 11/2010 | White |
| 2011/0244684 A1 | 10/2011 | Kamimura |
| 2012/0077422 A1 | 3/2012 | Yoshino |
| 2012/0094491 A1 | 4/2012 | Kanamaru |

FOREIGN PATENT DOCUMENTS

| | | |
|---|---|---|
| JP | 4-26160 A | 1/1992 |
| JP | 2008-068390 | 3/2008 |
| JP | 2008-068390 A * | 3/2008 |
| JP | 2008-179655 | 8/2008 |
| JP | 2009-238891 | 10/2009 |
| JP | 2010-284784 A | 12/2010 |
| JP | 2011-49496 | 3/2011 |
| WO | 2009/063844 | 5/2009 |
| WO | 2010/090024 | 8/2010 |

OTHER PUBLICATIONS

International Search Report dated Jan. 15, 2013 in PCT/JP2012/075504 filed Oct. 2, 2012.

Tsunenobu Kimoto, et al. "Step-Controlled Epitaxial Growth of SiC and Step Dynamics", Department of Electronic Science and engineering, Kyoto University, Dec. 25, 1995.

Shi, X., et al., "Extended study of the atomic step-terrace structure on hexagonal SiC (0 0 0 1) by chemical-mechanical planarization", Applied Surface Science 284 (2013), pp. 195-206.

* cited by examiner

SINGLE-CRYSTAL SILICON-CARBIDE SUBSTRATE AND POLISHING SOLUTION

CROSS-REFERENCE TO RELATED APPLICATIONS

The present application is a divisional application of U.S. patent application Ser. No. 14/246,556 filed Apr. 7, 2014, now abandoned, which is in turn a continuation application of International Application No. PCT/JP2012/075504, filed Oct. 2, 2012, which claims priority to Japanese Patent Application No. 2011-222782, filed on Oct. 7, 2011. The contents of these applications are incorporated herein by reference in their entirety.

TECHNICAL FIELD

The present invention relates to a single-crystal silicon-carbide substrate and a polishing solution, and in more detail, to a single-crystal silicon-carbide substrate suitable for forming a high quality semiconductor layer by epitaxial growth, and a polishing solution for obtaining the substrate.

BACKGROUND ART

Because silicon-carbide (SiC) semiconductor has a higher dielectric breakdown field and a larger saturated drift velocity of electron and thermal conductivity than those of a silicon semiconductor, research and development are made for realizing a power device capable of operating in higher speed at a higher temperature than those of the conventional silicon device. Above all, an attention has been attracted to the development of a high-efficient switching element used in a power source for driving a motor of a power-assisted bicycle, an electric vehicle, a hybrid car and the like. To realize such a power device, a single-crystal silicon-carbide substrate having smooth surface for forming a high quality silicon-carbide semiconductor layer by epitaxial growth is necessary.

Furthermore, a blue laser diode has attracted an attention as a light source for recording information in high density, and additionally, needs to a white diode as a light source in place of a fluorescent lamp or an electric bulb are increasing. Such a light-emitting element is prepared using a gallium nitride (GaN) semiconductor, and a single-crystal silicon-carbide substrate is used as a substrate for forming a high quality gallium nitride semiconductor layer.

High processing accuracy is required in flatness of a substrate, smoothness of a substrate surface and the like to the single-crystal silicon-carbide substrate used in such use applications. Furthermore, high cleanability is required regarding a residue such as an abrasive or the like derived from a polishing agent. However, because a silicon-carbide single crystal has extremely-high hardness and excellent corrosion resistance, workability in preparing a substrate is poor, and it is difficult to obtain a single-crystal silicon-carbide substrate having high smoothness while maintaining high polishing rate. Furthermore, even in the removal of the abrasive, because the silicon-carbide single crystal has excellent corrosion resistance, a method of removing an abrasive residue by lift-off using a chemical such as hydrofluoric acid as used in the cleaning of a silicon substrate is difficult to be applied. Therefore, it is difficult to obtain a substrate surface having high cleanliness.

In general, a smooth surface of a single crystal semiconductor substrate is formed by polishing. In the case of polishing silicon-carbide single crystal, the surface thereof is mechanically polished using an abrasive such as diamond or the like that is harder than silicon carbide as an abrasive material to form a smooth surface. In such a case, fine scratches according to a particle size of the diamond abrasive are incorporated in the surface of the single-crystal silicon-carbide substrate polished with the diamond abrasive. Furthermore, because an affected layer having mechanical strain is generated on the surface, the smoothness of the surface of the substrate is not sufficient as is.

In the production of a single crystal semiconductor substrate, chemical mechanical polishing (hereinafter referred to as "CMP") technique has been used as a method for smoothening the surface of a semiconductor substrate after mechanically polishing. CMP is a method of converting the surface of a material to be processed to an oxide or the like by utilizing a chemical reaction such as oxidation and removing the oxide formed using an abrasive having hardness lower than that of the material to be processed, thereby polishing the surface. This method has the advantage that an atomic step-and-terrace structure comprising atomic steps and terraces derived from a crystal structure is formed without generating strain on the surface of a material to be process, and extremely-smooth surface in atomic level can be formed.

The formation of a silicon-carbide semiconductor layer on a single-crystal silicon-carbide substrate by epitaxial growth is performed by depositing silicon atoms and carbon atoms by a thermal CVD method on an extremely-smooth surface in atomic level on which an atomic step-and-terrace structure has been formed by the CMP. In such a case, the front edge of the atomic step becomes the origin of epitaxial growth. Therefore, to obtain a high quality silicon-carbide semiconductor layer free of crystal defect, as surface properties required in a single-crystal silicon-carbide substrate, not only an atomic step-and-terrace structure derived from a crystal structure is formed, but high processing accuracy is required in the shape of the atomic step forming. Particularly, it is necessary in the front edge portion of the atomic step that crystal defect derived from mechanical damage by polishing is suppressed.

In the present description, the "atomic step-and-terrace structure" means a micro step-like structure comprising a plurality of flat "terraces" provided so as to be parallel to each other through step difference along a principal surface of a single crystal substrate and "atomic steps" that are step difference parts connecting the terraces. A linear site at which the upper edge of the atomic step contacts the terrace is defined as a "front edge portion of an atomic step". The "terrace", "atomic step" and "front edge portion of an atomic step" are further described hereinafter.

To form a high quality silicon-carbide semiconductor layer, there is a proposed method of conducting CMP by a colloidal silica slurry or a colloidal silica slurry containing an oxidizing agent after diamond polishing to form a high smoothness surface having an atomic step-and-terrace structure derived from the crystal structure, and further conducting etching by a gas-phase method (e.g., see Patent Document 1). In Patent Document 1, in the case where a silicon-carbide semiconductor layer is film-formed without conducting the etching treatment, step bunching occurs by an oxide formed extremely-near the surface of a substrate after CMP, however, by conducting the etching treatment, only a surface oxide layer generated by CMP can be removed while maintaining high smoothness of the surface of a substrate after CMP and crystal defect such as step bunching can be suppressed.

However, in Patent Document 1, although the formation of an atomic step-and-terrace structure derived from the crystal structure is considered, the influence of the edge shape of an atomic step and the crystal defect, to epitaxial growth of a crystal is not considered at all. Furthermore, merely suppressing the crystal defect of a silicon-carbide semiconductor layer by etching is not sufficient to obtain a high quality semiconductor layer. Further, higher polishing rate is required to be realized from the standpoint of cost.

A polishing composition containing a silica adhesive, an oxidizing agent (oxygen donor) such as hydrogen peroxide and vanadate is conventionally proposed as a polishing agent for polishing the surface of a single-crystal silicon-carbide substrate in high polishing rate and smoothly (e.g., see Patent Document 2).

However, in the polishing composition of Patent Document 2, there was the problem that a polishing rate to a single-crystal silicon-carbide substrate is low and time required for polishing is very long. There was further problem that although an atomic step-and-terrace structure is formed on the surface after polishing, the front edge portion of an atomic step becomes a shape having crack and dent due to mechanical damage at polishing and crystal defect occurs. Furthermore, there was a problem that silica abrasives that could not be removed by cleaning remain on a substrate and the abrasive residue causes crystal defect of a semiconductor layer epitaxially grown on the surface of a substrate after polishing.

CITATION LIST

Patent Literature

Patent Document 1: WO2010-090024
Patent Document 2: JP-A-2008-179655

SUMMARY OF THE INVENTION

Problems that the Invention is to Solve

The present invention has been made to solve the above problems, and has an object to provide a single-crystal silicon-carbide substrate suitable for epitaxially growing a high quality semiconductor layer free of crystal defect and a polishing solution for obtaining the single-crystal silicon-carbide substrate by CMP.

Means for Solving the Problem

The single-crystal silicon-carbide substrate according to the present invention has a principal surface having an atomic step-and-terrace structure comprising atomic steps and terraces derived from a crystal structure, wherein the atomic step-and-terrace structure has a proportion of an average line roughness of a front edge portion of the atomic step to a height of the atomic step being 20% or less.

In the single-crystal silicon-carbide substrate according to the present invention, the principal surface is preferably a surface on which a crystal is to be epitaxially grown to form a silicon-carbide semiconductor layer or a gallium-nitride semiconductor layer.

The polishing solution according to the present invention is a polishing solution for chemically and mechanically polishing a principal surface of a predetermined surface direction of a single-crystal silicon-carbide substrate, such that the principal surface has an atomic step-and-terrace structure comprising atomic steps and terraces derived from a crystal structure, and that the atomic step-and-terrace structure has a proportion of an average line roughness of a front edge portion of the atomic step to a height of the atomic step being 20% or less, in which the polishing solution comprises an oxidizing agent containing a transition metal having oxidation-reduction potential of 0.5V or more, and water, and does not contain an abrasive.

In the polishing solution according to the present invention, the oxidizing agent is preferably permanganate ions. And the permanganate ions is contained in an amount of 0.05% by mass or more and 5% by mass or less based on the total amount of a polishing agent. Further, the polishing solution preferably has pH of 11 or less and more preferably 5 or less.

Effect of the Invention

The single-crystal silicon-carbide substrate of the present invention has an atomic step-and-terrace structure derived from the crystal structure, wherein the proportion of an average line roughness (R) of a front edge portion of the atomic step to a height (h) of the atomic step is 20% or less. Because crystal defect or the like is suppressed on the front edge portion which is the origin of epitaxial crystal growth in a step flow method, by epitaxially growing on a principal surface of the single-crystal silicon-carbide substrate, a high quality silicon-carbide semiconductor layer or gallium-nitride semiconductor layer can be obtained.

The polishing solution of the present invention contains an oxidizing agent containing a transition metal having oxidation-reduction potential of 0.5V or more, and water, and does not contain an abrasive. Therefore, when a principal surface in a predetermined surface direction of the single-crystal silicon-carbide substrate is chemically and mechanically polished by using the polishing solution, high smoothness surface having an atomic step-and-terrace structure derived from the crystal structure and free of crystal defect in the front edge portion of the atomic step due to mechanical damage in polishing can be obtained. Furthermore, the polishing solution does not generate an abrasive residue on the single-crystal silicon-carbide substrate after cleaning.

BRIEF DESCRIPTION OF DRAWINGS

FIGS. 1A and 1B schematically show atomic step-and-terrace structure formed on a principal surface in the single-crystal silicon-carbide substrate of an embodiment of the present invention; FIG. 1A is a plane view and FIG. 1B is an enlarged perspective view.

FIG. 4A is a plane view and FIG. 4B is an enlarged perspective view.

MODE FOR CARRYING OUT THE INVENTION

The embodiment of the present invention is described below.

<Single-crystal Silicon-carbide Substrate>

Figure 1A:
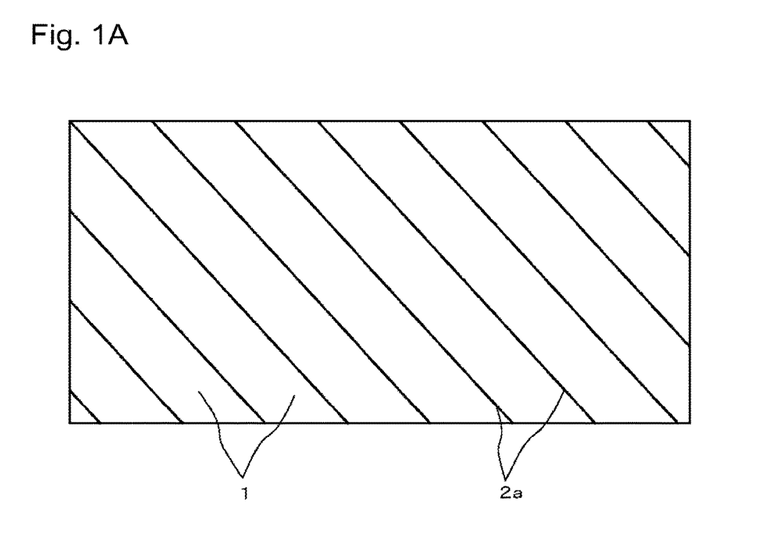
Figure 1B:
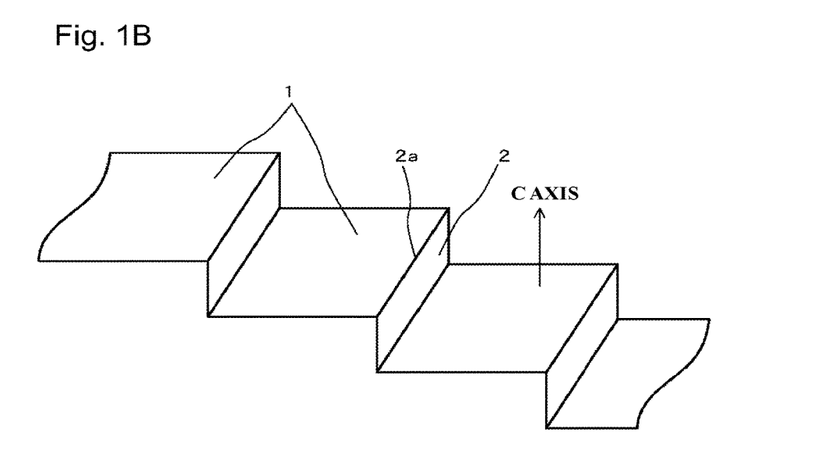

The single-crystal silicon-carbide substrate of an embodiment of the present invention has a high smoothness principal surface having an atomic step-and-terrace structure in which a flat terrace 1 region and an atomic step 2 of a step difference region, which are derived from a crystal structure, are alternately continued, as schematically shown in FIG. 1A and FIG. 1B. In the atomic step-and-terrace structure, a front edge portion 2a at which the upper edge of the atomic step 2 contacts the terrace 1 shows a straight line state, and is free of curvature, crack and dent. The width of the terrace 1 is nearly the same in all of terraces, and is nearly uniform in each terrace. C axis shown in FIG. 1B is a vertical direction to the paper face in FIG. 1A.

In the atomic step-and-terrace structure, the proportion of an average line roughness (R) of the front edge portion 2a of the atomic step 2 to a height (h) of the atomic step 2 is 20% or less. That is, $(R/h) \times 100 \leq 20$. The R/h can be considered as an index showing the degree of mechanical damage to the front edge portion 2a in the atomic step-and-terrace structure.

The principal surface having the atomic step-and-terrace structure is a principal surface in a predetermined surface direction and is a principal surface at a predetermined off angle to the C axis. The average line roughness (R) of the front edge portion 2a is arithmetical mean roughness (Ra) of the center line of a cross-section roughness curve of the front edge portion 2a, and can be measured by, for example, the following method. That is, a predetermined range (e.g., a range of 2 µm horizontal×1 µm vertical) on a principal surface of the single-crystal silicon-carbide substrate is observed with AFM (atomic force microscope), the respective arithmetical mean roughnesses (Ra) of a plurality of the front edge portions 2a fallen within the above range are measured from the obtained AFM image, and R is obtained as their average value.

The height (h) of the atomic step is about 0.25 nm in the single-crystal silicon-carbide substrate.

Figure 2:
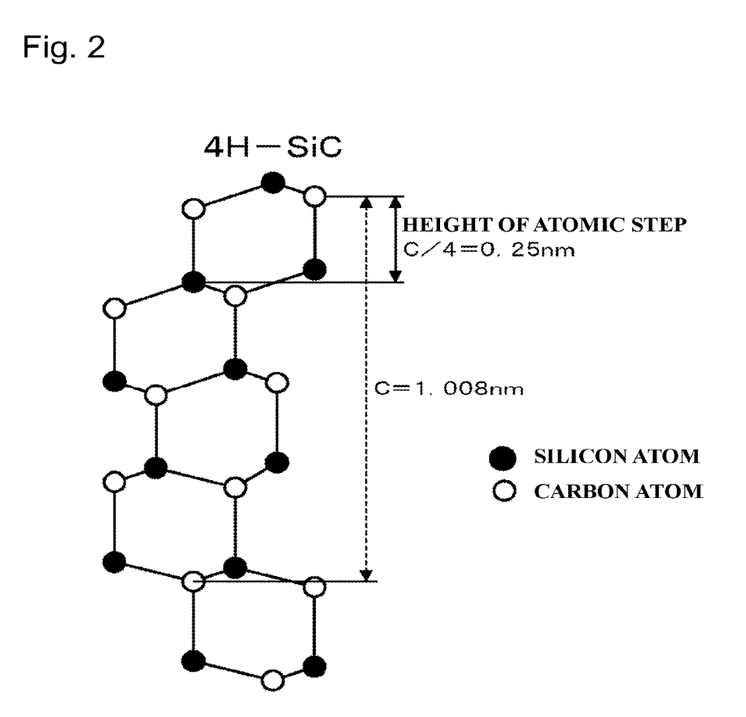
FIG. 2 is a view showing a crystal structure of 4H—SiC single crystal.

For example, a 4H—SiC substrate has the crystal structure shown in FIG. 2, and is that ¼ of C0 (1.008 nm) that is a crystal lattice interval (lattice constant) in a C axis direction is the height (h) of the atomic step. That is, in the 4H—SiC substrate, the height (h) of the atomic step is a value (about 0.25 nm) calculated from 1.008 nm/4.

The height (h) of the atomic step in a 6H—SiC substrate is about 0.25 nm similar to the 4H—SiC substrate. That is, in the 6H—SiC substrate, the lattice constant C0 in a C axis direction is 1.542 nm, and ⅙ of this value is the height (h) of the atomic step. Therefore, the height (h) of the atomic step is about 0.25 nm.

The 4H—SiC substrate and 6H—SiC substrate are described in the item of an object to be polished.

In the single-crystal silicon-carbide substrate of the embodiment, the principal surface in a predetermined surface direction has an atomic step-and-terrace structure derived from the crystal structure and has a high smoothness, and in addition, the proportion of the average line roughness (R) of the front edge portion 2a to the height (h) of the atomic step 2 is 20% or less. As a result, crystal defect or the like is suppressed in the front edge portion 2a which is the origin of epitaxial crystal growth in a step flow method. Therefore, a high quality silicon-carbide semiconductor layer or gallium nitride semiconductor layer can be obtained by epitaxially growing crystals on the principal surface of this single-crystal silicon-carbide substrate. The step flow method is described in detail in the item of epitaxial growth described below.

Where the proportion of the average line roughness (R) of the front edge portion 2a to the height (h) of the atomic step 2 exceeds 20%, crystal defect and the like due to mechanical damage of the front edge portion 1a in the atomic step-and-terrace structure become large, and thus a high quality silicon-carbide semiconductor layer or gallium-nitrile semiconductor layer cannot be formed by epitaxial growth.

Such a principal surface of the single-crystal silicon-carbide substrate having excellent shape at the front edge portion 2a and in which crystal defect at the portion is suppressed can be obtained by conducting CMP by using the polishing solution of the present invention that contains an oxidizing agent having large oxidation power and containing a transition metal having oxidation-reduction potential of 0.5V or more and does not substantially contain an abrasive.

<Polishing Solution>

The polishing solution of an embodiment of the present invention is a polishing solution for chemically and mechanically polishing a principal surface in a predetermined surface direction of a single-crystal silicon-carbide substrate, and the polishing solution contains an oxidizing agent containing a transition metal having oxidation-reduction potential of 0.5V or more and water, and does not contain an abrasive.

By conducting CMP of a principal surface of a single-crystal silicon-carbide substrate by using this polishing solution, scratch to the surface and crystal defect of the front edge portion of the atomic step, due to mechanical damage in polishing can be suppressed. Then, as described before, the polished principal surface having the atomic step-and-terrace structure derived from crystal structure and in which the proportion of the average line roughness (R) of the front edge portion to the height (h) of the atomic step is 20% or less ($(R/h) \times 100 \leq 20$) (hereinafter referred to as a "polished principal surface") can be obtained.

Furthermore, a substrate having high hardness and high chemical stability, such as a single-crystal silicon-carbide substrate, can be polished in sufficiently-high polishing rate by using such an oxidizing agent having strong oxidation power in the atomic level processing. In the case where this polishing solution has been used, an abrasive does not remain on the single-crystal silicon-carbide substrate after cleaning. As a result, the occurrence of crystal defect due to an abrasive residue can be prevented.

As the oxidizing agent contained in the polishing solution of the embodiment of the present invention, permanganate ion is preferred, and its content is preferably 0.05% by mass or more and 5% by mass or less. The pH of the polishing solution is preferably 11 or less, and more preferably 5 or less. To adjust the pH to 11 or less, a pH adjuster can be added to the polishing solution. In the case where the pH of the polishing solution is 11 or less, the oxidizing agent acts effectively, and as a result, polishing rate is high and polishing performances are good.

Each component and pH of the polishing solution of the present invention is described below.

(Oxidizing Agent)

The oxidizing agent containing a transition metal having oxidation-reduction potential of 0.5V or more contained in the polishing solution of the embodiment of the present invention forms an oxide layer on a face to be polished of the single-crystal silicon-carbide substrate that is an object to be polished. The polishing of the object to be polished is accelerated by removing the oxide layer by mechanical power from the face to be polished. That is, although the silicon carbide single crystal that is a non-oxide is a polishing-difficult material, an oxide layer can be formed on the surface by an oxidizing agent containing a transition metal having oxidation-reduction potential of 0.5V or more in the polishing solution. The oxide layer formed has low hardness and is easy to be polished as compared with that of the object to be polished, and thus the oxide layer can be removed by the contact with a polishing pad that does not contain an abrasive therein. Therefore, sufficiently-high polishing rate can be achieved. An oxidation-reduction potentiometer generally commercially available can be used for an oxidation-reduction potential measurement method. A silver/silver chloride electrode in which a saturated potassium chloride aqueous solution was used as an internal liquid can be used as a reference electrode, and a metal electrode such as platinum can be used as a working electrode. Regarding a temperature and pH of the aqueous solution at measuring, the measurement is performed at room temperature near 25° C., and the pH can be measured by preparing samples appropriately adjusted.

In the present invention, the "face to be polished" is a face of an object to be polished, which is polished, and means, for example, a surface.

Examples of the oxidizing agent containing a transition metal having oxidation-reduction potential of 0.5V or more and contained in the polishing solution include permanganate ion, vanadate ion, dichromate ion, cerium ammonium nitrate, iron (III) nitrate nonahydrate, silver nitrate, phosphotungstic acid, silicotungstic acid, phosphomolybdic acid, phosphotungstomolybdic acid, and phosphovanadomolybdic acid. Permanganate ion is particularly preferred. Permanganate such as potassium permanganate or sodium permanganate is preferred as a supply source of the permanganate ion.

The reasons that permanganate ion is particularly preferred as the oxidizing agent in the polishing of the single-crystal silicon-carbide substrate are described below.
(1) Permanganate ion has strong oxidation power that oxidizes silicon-carbide single crystal.

In the case where the oxidation powder of the oxidizing agent is too weak, the reaction with a face to be polished of the single-crystal silicon-carbide substrate becomes insufficient, and as a result, sufficiently-smooth surface cannot be obtained. Oxidation-reduction potential is used as an index of oxidation power that an oxidizing agent oxidizes a material. Oxidation-reduction potential of permanganate ion is 1.70V, and the oxidation-reduction potential is higher than that of potassium perchlorate ($KClO_4$) (oxidation-reduction potential: 1.20V) and sodium hypochlorite (NaClO) (oxidation-reduction potential: 1.63V) that are generally used as an oxidizing agent.
(2) Permanganate ion has large reaction rate.

The permanganate ion has a large reaction rate of an oxidation reaction as compared with hydrogen peroxide (oxidation-reduction potential: 1.76V) that is known as an oxidizing agent having strong oxidation power, and therefore can quickly exhibit the strength of oxidation power.
(3) Permanganate ion has low toxicity to human body and is safe.
(4) Permanganate is completely dissolved in water that is a dispersion medium described below under the condition of dissolved concentration or lower concentration that is obtained from a solubility curve and depends on water temperature. Therefore, the dissolved residue does not adversely affect smoothness of a substrate.

To obtain a high polishing rate, the content (concentration) of the permanganate ion in the polishing solution is preferably from 0.05% by mass to 5% by mass. In the case of less than 0.05% by mass, the effect as an oxidizing agent is not expected, and there is a concern that very long time is required to form a smooth surface by polishing or scratch occurs on a face to be polished. In the case where the content of permanganate ion exceeds 5% by mass, depending on a temperature, the permanganate is not completely dissolved and precipitates, and there is a concern that scratch is generated by that solid permanganate contacts a face to be polished. The content of the permanganate ion contained in the polishing solution is more preferably 0.1% by mass or more and 4% by mass or less, and particularly preferably 0.2% by mass or more and 3.5% by mass or less.
(Abrasive)

The polishing solution of an embodiment of the present invention is characterized by substantially not containing a polishing abrasive such as silicon oxide (silica) particles, cerium oxide (ceria) particles, aluminum oxide (alumina) particles, zirconium oxide (zirconia) particles, and titanium oxide (titania) particles. Because the polishing solution does not contain an abrasive and abrasive residue is not generated after cleaning as described before, the occurrence of crystal defect due to abrasive residue can be prevented. Furthermore, there are advantages that the polishing solution can be used without paying attention to dispersibility of an abrasive, and because aggregation of an abrasive does not substantially occur, mechanical damage to a face to be polished is suppressed.
(pH and pH Adjuster)

The pH of the polishing solution of an embodiment of the present invention is preferably 11 or less, more preferably 5 or less, and particularly preferably 3 or less, from the standpoint of polishing performances. In the case where the pH exceeds 11, there is a concern that not only sufficient polishing rate is not obtained, but smoothness of a face to be polished is deteriorated.

The pH of the polishing solution can be adjusted by the addition/blending of an acidic or basic compound that is a pH adjuster. Examples of the acid that can be used include inorganic acids such as nitric acid, sulfuric acid, phosphoric acid, and hydrochloric acid; saturated carboxylic acids such as formic acid, acetic acid, propionic acid, and butyric acid; hydroxy acids such as lactic acid, malic acid and citric acid; aromatic carboxylic acids such as phthalic acid and salicylic acid; dicarboxylic acids such as oxalic acid, malonic acid, succinic acid, glutaric acid, adipic acid, fumaric acid, and maleic acid; and organic acids such as amino acid and heterocyclic carboxylic acids. Nitric acid and phosphoric acid are preferably used, and of those, nitric acid is particularly preferably used. Examples of the basic compound that can be used include ammonia, lithium hydroxide, potassium hydroxide, sodium hydroxide, quaternary ammonium compound such as tetramethyl ammonium, and organic amines such as monoethanolamine, ethylethanolamine, diethanolamine, and propylenediamine. Potassium hydroxide and sodium hydroxide are preferably used, and of those, potassium hydroxide is particularly preferably used.

The content (concentration) of those acidic or basic compounds is an amount that adjusts the pH of the polishing solution to a predetermined range (pH 11 or less, more preferably 5 or less, and still more preferably 3 or less).
(Water)

In the polishing solution of an embodiment of the present invention, water is contained as a dispersion medium. Water is a medium for dispersing and dissolving the oxidizing agent described above and optional components described below that are added as necessary. The water is not particularly limited, but pure water, ultrapure water and ion-exchanged water (deionized water) are preferred from the standpoints of influence to blending components, contamination of impurities and influence to pH.

(Preparation of Polishing Solution and Optional Components)

The polishing solution of an embodiment of the present invention is prepared so that the respective components described above are contained in the predetermined proportions and are mixed so as to become uniformly dissolved and mixed state, and then used. For mixing, use can be made of a stirring mixing method by stirring blades which is generally used in the production of a polishing solution. It is not necessary to supply the polishing solution to the polishing site as one in which all of polishing components as constituents have been previously mixed. Polishing components may be mixed when supplying to the polishing side, thereby forming a composition of a polishing solution.

The polishing solution of an embodiment of the present invention can appropriately contain lubricants, chelating agents, reducing agents, thickeners, viscosity adjusters, corrosion inhibitors and the like, as necessary as long as it does not conflict with the spirit of the present invention. However, in the case where those additives have the function of an oxidizing agent or an acid or basic compound, those additives are handled as an oxidizing agent or an acid or basic compound.

As the lubricant, use can be made of anionic, cationic, nonionic, and amphoteric surfactants, polysaccharides, water-soluble polymers and the like. As the surfactant, use can be made of those having a hydrophobic group such as an aliphatic hydrocarbon group or an aromatic hydrocarbon group, or which has at least one of bonding groups such as ester, ether and amide and linking groups such as acyl group and alkoxyl group introduced in these hydrophobic group, and those having a hydrophilic group having carboxylic acid, sulfonic acid, sulfuric acid ester, phosphoric acid, phosphoric acid ester and amino acid. As the polysaccharide, use can be made of alginic acid, pectin, carboxymethyl cellulose, curdlan, pullulan, xanthan gum, carrageenan, gellan gum, locust bean gum, gum arabic, tamarind, and psyllium. As the water-soluble polymer, use can be made of polyacrylic acid, polyvinyl alcohol, polyvinyl pyrrolidone, polymethacrylic acid, polyacrylamide, polyaspartic acid, polyglutamic acid, polyethylene imine, polyacrylamine, and polystyrene sulfonate.

<Polishing Method>

To conduct the polishing by using the polishing solution of an embodiment of the present invention, the conventional polishing pad that does not contain an abrasive therein is used, the polishing pad is contacted with a face to be polished of a single-crystal silicon-carbide substrate that is an object to be polished, while supplying the polishing solution to the polishing pad, and the polishing is conducted by relative movement of those. The object to be polished is described below.

In this polishing method, the conventional polishing apparatus can be used as a polishing apparatus. An example of the usable polishing apparatus is shown in FIG. 3.

Figure 3:
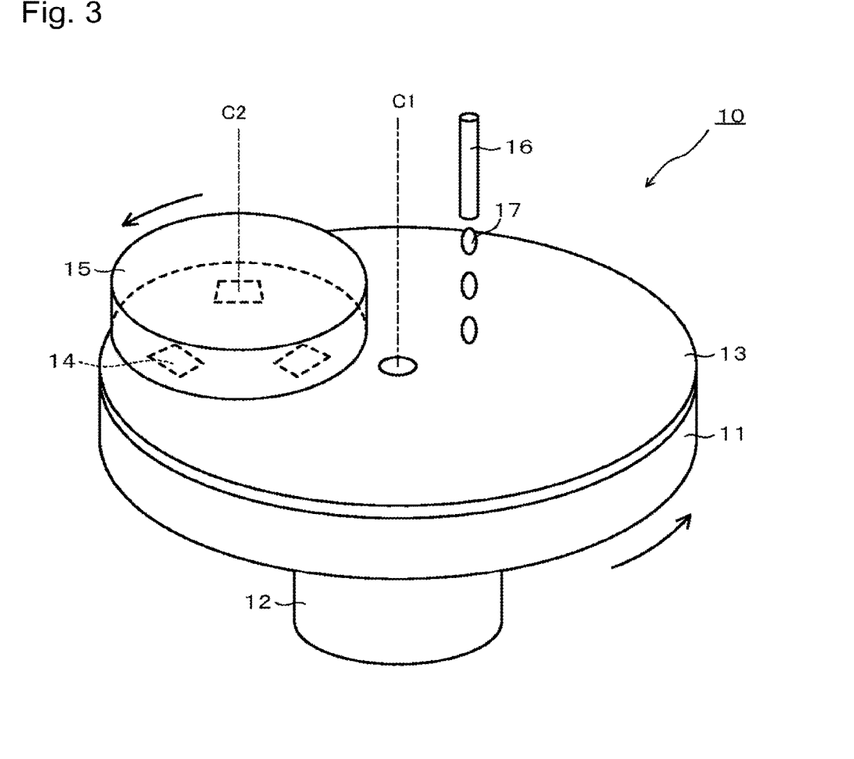
FIG. 3 is a view showing an example of a polishing apparatus usable in the polishing using the polishing solution of an embodiment of the present invention.

In the polishing apparatus 10 shown in FIG. 3, a polishing surface plate 11 is provided in the state of being rotatably supported around its vertical shaft center C1. The polishing surface plate 11 is rotation-driven in a direction shown by an arrow in the Figure by a surface plate drive motor 12. A conventional polishing pad 13 that does not contain an abrasive therein is adhered to the upper surface of the polishing surface plate 11.

On the other hand, at an eccentric position from the shaft center C1 on the polishing surface plate 11, a substrate holding member (carrier) 15 that holds an object 14 to be polished on the lower surface thereof by adsorption or using a holding frame is supported rotatably around its shaft center C2 and movably in a direction of the shaft center C2. The substrate holding member 15 is constituted so as to rotate in a direction shown by an arrow by a carrier drive motor not shown or a rotation moment received from the polishing surface plate 11. A single-crystal silicon-carbide substrate that is the object 14 to be polished is held on the lower surface of the substrate holding member 15, that is, a surface facing the polishing pad 13. The object 14 to be polished is pushed to the polishing pad 13 by a predetermined load.

A dropping nozzle 16 or a spray nozzle (not shown) is provided in the vicinity of the substrate holding member 15, and the above-described polishing solution 17 send from a tank not shown is supplied on the polishing surface plate 11.

In polishing by the polishing apparatus 10, the object 14 to be polished held on the substrate holding member 15 is pushed to the polishing pad 13 in the state that the polishing surface plate 11 and the polishing pad 13 adhered thereto, and the substrate holding member 15 and the object 14 to be polished held on the lower surface thereof are rotation-driven around the respective axis centers by the surface plate drive motor 12 and the carrier drive motor, while supplying the polishing solution 17 to the surface of the polishing pad 13 from the dropping nozzle 16 or the like. By this operation, the face to be polished of the object 14 to be polished, that is, the surface facing the polishing pad 13, is chemically and mechanically polished.

The substrate holding member 15 may perform not only rotational motion but straight-line motion. Further, the polishing surface plate 11 and the polishing pad 13 may not perform rotational motion and for example may move in one direction by a belt system.

As the polishing pad 13, use can be made of the conventional polishing pad comprising a non-woven fabric or a porous resin such as foamed polyurethane and not containing an abrasive. To accelerate the supply of the polishing solution 17 to the polishing pad 13 or to keep a constant amount of the polishing solution 17 in the polishing pad 13, groove processing such as a lattice pattern, a concentric pattern or a helical pattern may be applied to the surface of the polishing pad 13. Furthermore, if necessary, the polishing may be performed while performing conditioning of the surface of the polishing pad 13 by contacting a pad conditioner with the surface of the polishing pad 13.

Polishing conditions by the polishing apparatus 10 are not particularly limited. Polishing pressure can be further increased by pushing the polishing pad 13 to the substrate holding member 15 by applying load, thereby improving the polishing rate. The polishing pressure is preferably from about 5 to 80 kPa, and is more preferably from about 10 to 50 kPa from the standpoints of uniformity of polishing rate, flatness and prevention of polishing defect such as scratch in a face to be polished. The number of revolution of the polishing surface plate 11 and the substrate holding member 15 is preferably from about 50 to 500 rpm, but is not limited to this. The amount of the polishing solution 17 supplied is appropriately adjusted and selected by the composition of the polishing solution and the polishing conditions described above.

<Object to be Polished>

The object to be polished that is polished by using the polishing solution of an embodiment of the present invention is a single-crystal silicon-carbide substrate or a single-crystal gallium-nitride substrate that is a non-oxide single crystal, and is more preferably a single-crystal silicon-carbide substrate. More specifically, a single-crystal silicon-carbide substrate having crystal structure of 3C—SiC, 4H—SiC or 6H—SiC can be mentioned. The 3C-, 4H- and 6H- show crystal polymorph of silicon carbide determined by the lamination order of Si—C pair. High polishing rate can be achieved by using the polishing solution of the embodiment. Furthermore, a principal surface (polished principal surface) having the following surface properties can be obtained.

In each case of using the polishing solution of an embodiment of the present invention and the case of using a conventional polishing slurry containing hydrogen peroxide as an oxidizing agent and colloidal silica abrasive, respective surface properties of the principal surface of the single-crystal silicon-carbide substrate obtained by CMP and the formation of a semiconductor layer by epitaxial growth onto the polished principal surface are described below by referring to the drawings.

<Surface Properties of Polished Principal Surface>

Figure 4A:
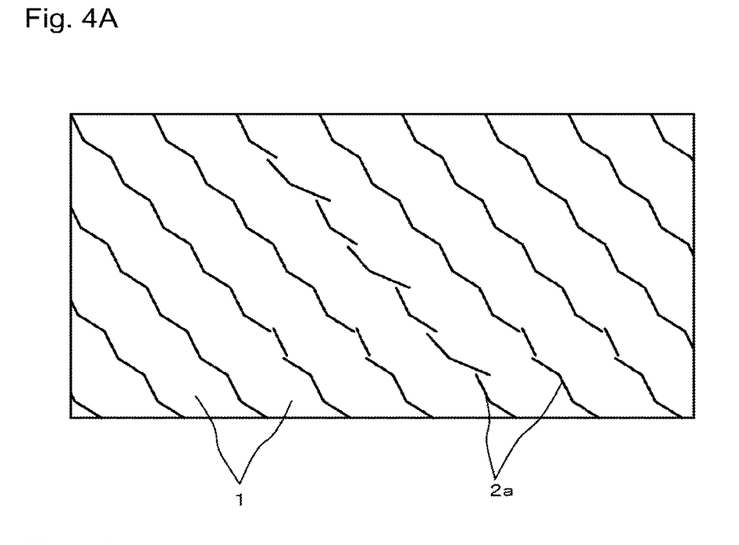
FIGS. 4A and 4B schematically show an atomic step-and-terrace structure formed on a principal surface in the single-crystal silicon-carbide substrate polished by using the conventional polishing agent solution.
Figure 4B:
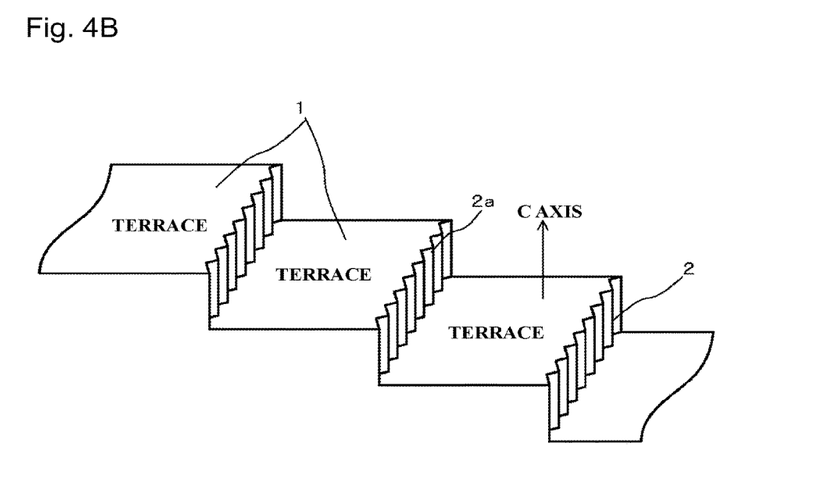

Mechanical damage due to diamond polishing is generated on the principal surface of the single-crystal silicon-carbide substrate after diamond polishing that is a pre-step of a CMP step, and not only scratch is formed on the surface, but an affected layer in which defect such as crystal strain was generated inside is formed. By conducting polishing for a considerably long period of time, even CMP by the conventional polishing slurry can remove the affected layer generated due to diamond polishing, and the polished principal surface having an atomic step-and-terrace structure in which a flat terrace 1 region and an atomic step 2 of a step difference region, which are derived from a crystal structure, are alternately continued as schematically shown in FIGS. 4(*a*) and 4(*b*), can be obtained. The C axis shown in FIG. 4B is a direction vertical to the paper face in FIG. 4A.

However, in CMP by the conventional polishing slurry described above, the front edge portion 2*a* of the atomic step 2 becomes a shape having crack or dent due to mechanical damage at polishing, and crystal defect occurs. Excessive polishing of the front edge portion 2*a* by an abrasive having strong mechanical action is considered as the cause of the crystal defect.

On the other hand, the polishing solution of an embodiment of the present invention does not substantially contain abrasive. Therefore, in the atomic step-and-terrace structure formed on the polished principal surface, mechanical damage applied to the front edge portion 2*a* of the atomic step is considerably reduced. As a result, the front edge portion 2*a* free of crack, dent and crystal defect can be formed as shown in FIG. 1A and FIG. 1B, and processing accuracy in atomic level in which smoothness is high and the front edge portion 2*a* maintains excellent shape can be achieved. Further, in the case of using the polishing solution of the embodiment, by the action of the contained oxidizing agent having strong oxidation power, an affected layer due to diamond polishing can be promptly removed in high polishing rate by only mechanical action by a polishing pad having hardness lower than that of an abrasive, even though mechanical action by an abrasive is not applied. Accordingly, high processing accuracy in atomic level in which damage to the face to be polished of a single-crystal silicon-carbide substrate has been suppressed is possible.

<Epitaxial Growth>

Figure 5:
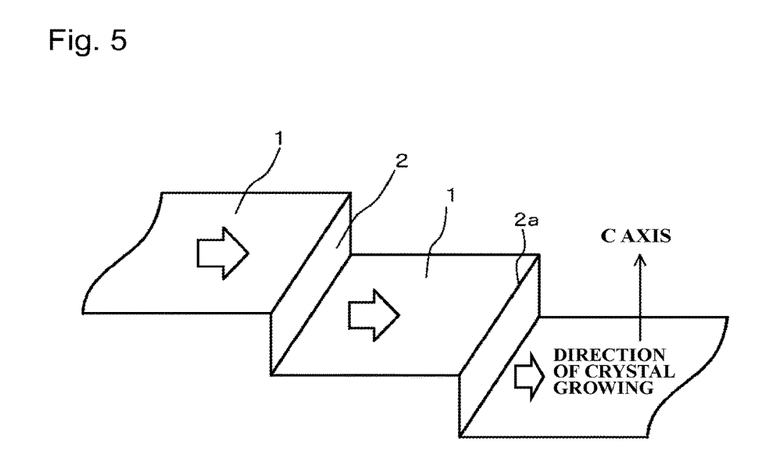
FIG. 5 is a view schematically showing epitaxial growth by a step flow method on a single-crystal silicon-carbide substrate.

Mechanism of epitaxial growth of a semiconductor layer on a single-crystal silicon-carbide substrate by a step flow method, and a role of a front edge portion of an atomic step are described on the basis of FIG. 5.

To epitaxially grow, for example, a silicon carbide semiconductor layer on a single-crystal silicon-carbide substrate, silicon atoms and carbon atoms are deposited by a thermal CVD method on the polished principal surface having formed thereon an atomic step-and-terrace structure of the single-crystal silicon-carbide substrate, followed by crystal growth. Each atom adhered to the terrace 1 of the atomic step-and-terrace structure reaches the front edge portion 2*a* and bonds to an atom having dangling bond of the front edge portion 2*a*, and crystal is grown in a horizontal direction (a direction perpendicular to the front edge portion 2*a*; shown by an arrow in FIG. 5) on the surface of the terrace 1, thereby a film is formed. That is, the front edge portion 2*a* of the atomic step 2 functions as the origin of crystal growth in epitaxial growth.

It is known that crystal quality of a semiconductor layer film-formed on a single-crystal silicon-carbide substrate is strongly influenced by crystal defect and surface state of the substrate. Examples of the crystal defect of the single-crystal silicon-carbide substrate include micropipe defect, screw dislocation defect, and edge dislocation defect. Examples of the surface state include scratch by polishing, adhesion of contamination such as an abrasive derived from a polishing agent to the surface of the terrace 1, and a surface oxide of the terrace 1. Regarding the front edge portion 2*a* of the atomic step 2 that is the origin of epitaxial growth, the propagation of defect present on this portion is considered. Therefore, to film-form higher quality semiconductor layer, not the polishing in which only the formation of an atomic step-and-terrace structure has been considered, but processing accuracy in atomic level in which the shape of the front edge portion 2*a* of the atomic step 2 and the crystal defect have been considered is necessary.

Considering from the above point, the polished principal surface of the single-crystal silicon-carbide substrate obtained by using the conventional slurry is that because the atomic step-and-terrace structure is formed and smoothened, crystal defect of a semiconductor layer due to scratch and the like on the surface of the terrace 1 can be suppressed, but because the front edge portion 2*a* that is the origin of crystal growth has crack, dent and the like and becomes the shape which the crystal defect is unavoidable, high quality silicon-carbide semiconductor layer or gallium-nitride semiconductor layer can not be formed thereon by epitaxial growth.

On the other hand, in CMP processing using the polishing solution of an embodiment of the present invention, a high-smooth principal surface having an atomic step-and-terrace structure in which mechanical damage to the front edge portion 2*a* of the atomic step 2 has been suppressed in the atomic step-and-terrace structure can be obtained, and as a result, crystal growth of higher quality semiconductor layer becomes possible. Furthermore, because the polishing solution of an embodiment of the present invention does not contain an abrasive, an abrasive does not remain on the surface of a single-crystal silicon-carbide substrate even after cleaning, and crystal defect of a semiconductor layer due to abrasive residue derived from a polishing agent can be prevented.

EXAMPLES

The present invention is specifically described below by reference to examples and comparative examples, but the invention is not limited to those examples. Examples 1 to 4 are examples of the present invention, and Examples 5 and 6 are comparative examples.

(1) Preparation of Polishing Solution and Polishing Agent Solution (1-1)

Each polishing solution of Examples 1 to 4 was prepared as follows. Pure water was added to potassium permanganate that is an oxidizing agent shown in Table 1, followed by stirring for 10 minutes using stirring blades. As a pH adjuster, nitric acid in Examples 1 to 3 and potassium hydroxide in Example 4 were gradually added to the resulting solution while stirring to adjust to a predetermined pH shown in Table 1. Thus, each polishing solution was obtained. The content (concentration: % by mass) of potassium permanganate that is an oxidizing agent used in each example to the whole polishing solution is shown in Table 1. The concentration of an oxidizing agent in Table 1 is not a concentration of permanganate ions, but is a concentration of potassium permanganate.

(1-2)

Polishing agent solutions of Examples 5 and 6 were prepared as follows. In Example 5, pure water was added to a colloidal silica dispersion having a primary particle size of 40 nm, a secondary particle size of about 70 nm and a silica solid content of about 40 wt %, followed by stirring for 10 minutes by using stirring blades. Ammonium vanadate as a metal salt was added to the resulting solution while stirring, and hydrogen peroxide was added last thereto, followed by stirring for 30 minutes. Thus, a polishing agent solution adjusted to each component concentration shown in Table 1 was obtained.

In Example 6, pure water was added to a colloidal silica dispersion having a primary particle size of 80 nm, a secondary particle size of about 110 nm and a silica solid content of about 40 wt %, followed by stirring for 10 minutes. Potassium permanganate as an oxidizing agent was added to the resulting solution while stirring, and nitric acid was then gradually added thereto to adjust to pH as shown in Table 1. Thus, a polishing agent solution was obtained. The content (concentration: % by mass) of each component used in Examples 5 and 6 to the whole polishing agent is shown in Table 1.

The concentration of the oxidizing agent in Table 1 is not a concentration of permanganate ions, but is a concentration of potassium permanganate. The primary particle size of silica particles blended in Examples 5 and 6 was obtained by converting from a specific surface area obtained by a BET method, and the secondary particle size was measured by using Microtrac UPA (manufactured by Nikkiso Co., Ltd) that is a dynamic light-scattering particle size analyzer.

(2) Measurement of pH

The pH of each of the polishing solutions obtained in Examples 1 to 4 and each of the polishing agent solutions obtained in Examples 5 and 6 was measured at 25° C. by using pH81-11 manufactured by Yokokawa Electric Corporation. The measurement results are shown in Table 1.

(3) Evaluation of Polishing Performances

Regarding each of the polishing solutions obtained in Examples 1 to 4 and each of the polishing agent solutions obtained in Examples 5 and 6, polishing performances were evaluated by the following methods.

(3-1) Polishing Conditions

Small-sized one side polishing apparatus manufactured by MAT Inc. was used as a polishing machine. SUBA800-XY-groove (manufactured by Nitta-Haas Incorporated) was used as a polishing pad, and conditioning of the polishing pad was conducted by using a diamond disk and a brush before polishing.

Polishing was conducted for 30 minutes under the conditions of supply rate of the polishing solution or polishing agent solution: 25 cm$^3$/min, the number of revolution of a polishing surface plate: 68 rpm, the number of revolution of a substrate holding part: 68 rpm, and polishing pressure: 5 psi (34.5 kPa).

(3-2) Material to be Polished

As a material to be polished, 4H—SiC substrate having a diameter of 3 inches, having been subjected to a preliminary polishing treatment using diamond abrasive was prepared. A single-crystal SiC substrate (On-axis substrate) in which off angle to C axis of the principal surface (0001) is within 0°+0.25° was used, and Si surface side was polished and evaluated.

(3-3) Measurement of Polishing Rate

Polishing rate was evaluated by amount of thickness change per unit time (nm/hr) of the single-crystal SiC substrate. Specifically, mass of an unpolished substrate having a known thickness and mass of the substrate after polishing for each period of time were measured, and the mass change was obtained from the difference. The change per unit time of the thickness of the substrate obtained from the mass change was calculated by using the following equation. The calculation results of the polishing rate are shown in Table 1.

(Calculation Formula of Polishing Rate (V))

$$\Delta m = m0 - m1$$

$$V = \Delta m/m0 \times T0 \times 60/t$$

(In the formula, $\Delta m$ (g) is mass change before and after polishing, m0 (g) is initial mass of an unpolished substrate, m1 (g) is mass of the substrate after polishing, V is polishing rate (nm/hr), T0 is a thickness of an unpolished substrate (nm), and t is a polishing time (min))

(3-4) Measurement of Average Line Roughness (R) of Front Edge Portion of Atomic Step The principal surface of On-axial substrate after polishing, which has been polished with the respective polishing solutions of Examples 1 to 4 and the respective polishing agent solutions of Examples 5 and 6 was observed with AFM in an area of 2 μm horizontal×1 μm vertical. As a result, the formation of an atomic step-and-terrace structure was confirmed in all cases. The respective average line roughness (Ra) of a plurality of front edge portions in the above area were measured from the AFM images obtained, and its average value was defined as R. D3100 (manufactured by Veeco) was used as AFM.

Figure 6:
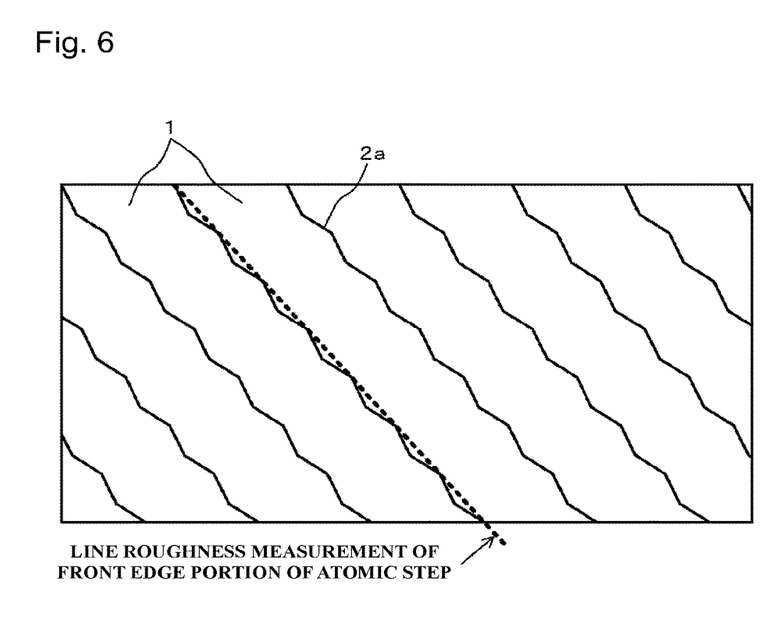
FIG. 6 is a view showing measurement position of line roughness of a front edge portion of the atomic step-and-terrace structure formed after CMP polishing in Examples 1 to 6.

Measurement position of the average line roughness (Ra) of the front edge portion 2a is shown by a broken line in FIG. 6. In this Figure, reference numeral 1 indicates a terrace in an atomic step-and-terrace structure.

Proportion (A) of the average line roughness (R) to a height (h) of the atomic step was calculated from the average line roughness (R) of the front edge portion obtained in (3-4) above by using the following formula. The result is shown in Table 1.

$$A\ (\%) = (R\ (nm)/h\ (nm)) \times 100$$

The height (h) of a bilayer atomic step comprising silicon and carbon pair is calculated from 1.008 nm/4 as described above, and is about 0.25 nm.

TABLE 1

| | Kind of abrasive | Abrasive concentration (% by mass) | Secondary particle size of abrasive | Kind of oxidizing agent | Concentration of oxidizing agent (% by mass) | Kind of metal salt | Concentration of metal salt (% by mass) | pH adjuster | pH | Polishing rate of On-axis substrate (nm/hr) | Proportion of average line roughness (nm) of front edge portion to height of atomic step (%) |
|---|---|---|---|---|---|---|---|---|---|---|---|
| Ex. 1 | — | — | — | Potassium permanganate | 1.58 | — | — | Nitric acid | 2 | 523 | 16 |
| Ex. 2 | — | — | — | Potassium permanganate | 5 | — | — | Nitric acid | 2 | 962 | 16 |
| Ex. 3 | — | — | — | Potassium permanganate | 3.16 | — | — | Nitric acid | 5 | 427 | 20 |
| Ex. 4 | — | — | — | Potassium permanganate | 3.16 | — | — | KOH | 10 | 302 | 16 |
| Ex. 5 | Colloidal silica | 20 | 0.07 | Hydrogen peroxide | 1 | Ammonium vanadate | 0.5 | — | 6.5 | 69 | 24 |
| Ex. 6 | Colloidal silica | 20 | 0.11 | Potassium permanganate | 1.58 | — | — | Nitric acid | 2 | 55 | 28 |

As can be seen from Table 1, in the case of using the polishing solutions of Examples 1 to 4, high polishing rate is obtained to single-crystal SiC On-axis substrate, and high speed polishing was possible. Furthermore, the formation of the atomic step-and-terrace structure is confirmed from AFM image of the principal surface after polishing, and highly-smooth polished principal surface was obtained. Furthermore, in the atomic step-and-terrace structure, the proportion (A) of the average line roughness (R) of the front edge portion of the atomic step to the theoretical value of the height (h) of the atomic step is 20% or less, and high processing accuracy in atomic level in which mechanical damage due to polishing had been suppressed was obtained. Moreover, because the polishing solution did not contain an abrasive, high cleanliness polished principal surface free of abrasive residue was obtained.

On the other hand, in the case of using the polishing agent solution of Example 5 containing colloidal silica as an abrasive, hydrogen peroxide as an oxidizing agent, and ammonium vanadate, the polishing rate was remarkably low value as compared with the case of using the polishing solutions of Examples 1 to 4. Furthermore, although the formation of the atomic step-and-terrace structure is confirmed from AFM image of the principal surface after polishing, the proportion of the average line roughness (R) of the front edge portion of the atomic step to the theoretical value of the height (h) of the atomic step is 24% which is larger as compared with Examples 1 to 4, and thus, the surface roughness is deteriorated. It was seen that crack and dent are generated in the front edge portion of the atomic step by mechanical damage due to polishing. Furthermore, abrasive residue that seems to be colloidal silica was observed on the polished principal surface.

Even in the case of using the polishing agent solution of Example 6 containing potassium permanganate as an oxidizing agent and further containing colloidal silica as an abrasive, the polishing rate was greatly decreased as compared with the case of using the polishing solutions of Examples 1 to 4. Furthermore, although the formation of the atomic step-and-terrace structure was confirmed from AFM image of the principal surface after polishing, the proportion of the average line roughness (R) of the front edge portion of the atomic step to the theoretical value of the height (h) of the atomic step is 28% which is larger as compared with Examples 1 to 4, and thus, the surface roughness is deteriorated. It was seen that crack and dent are generated in the front edge portion of the atomic step by mechanical damage due to polishing. Furthermore, abrasive residue that seems to be colloidal silica was observed on the polished principal surface.

INDUSTRIAL APPLICABILITY

According to the polishing solution of the present invention, a single-crystal silicon-carbide substrate having high hardness and high chemical stability can be polished in high polishing rate, and the principal surface having high processing accuracy in atomic level in which the atomic step-and-terrace structure free of scratch and having excellent flatness and smoothness was formed, mechanical damage of the front edge portion of the atomic step that becomes the origin of crystal growth in epitaxial growth in a step flow method was suppressed can be obtained. Therefore, film formation of high quality semiconductor layer on a single-crystal silicon-carbide substrate becomes possible, and this can contribute to the improvement in productivity of electronic device and the like using a single-crystal silicon-carbide substrate having the semiconductor layer thus film-formed thereon.

Although the present invention has been described in detail and by reference to the specific embodiments, it is apparent to one skilled in the art that various modifications or changes can be made without departing the spirit and scope of the present invention.

DESCRIPTION OF REFERENCE NUMERALS AND SIGNS

1 ... Terrace; 2 ... Atomic step; 2a ... Front edge portion; 10 ... Polishing apparatus; 11 ... Polishing surface plate; 12 ... Surface plate drive motor; 13 ... Polishing pad; 14 ... Object to be polished; 15 ... Substrate holding member; 16 ... Dropping nozzle; and 17 ... Polishing solution

The invention claimed is:
1. A single-crystal silicon-carbide substrate comprising a polished principal surface having an atomic step-and-terrace structure, the atomic step-and-terrace structure comprising atomic steps and terraces derived from a crystal structure, wherein the atomic step-and-terrace structure has an average proportion of an average line roughness of a front edge portion of the atomic step to a height of the atomic step being 20% or less, and the average line roughness is measured from an AFM image in an area of 2 μm×1 μm.

2. The single-crystal silicon-carbide substrate according to claim 1, wherein the polished principal surface is a surface on which a crystal is to be epitaxially grown to form a silicon-carbide semiconductor layer or a gallium-nitride semiconductor layer.

3. The single-crystal silicon-carbide substrate according to claim 1, wherein a width of the terrace is substantially the same in each terrace.

4. The single-crystal silicon-carbide substrate according to claim 1, wherein the front edge portion of the atomic step is a straight line having the average line roughness.

5. The single-crystal silicon-carbide substrate according to claim 1, wherein the single-crystal silicon-carbide substrate is obtained by a process comprising:
polishing a surface of a single-crystal silicon-carbide substrate with a polishing pad in the presence of a polishing solution by moving the polishing pad relative to the surface,
wherein the polishing solution comprises: an oxidizing agent which comprises a transition metal having oxidation-reduction potential of 0.5 V or more, and
wherein the polishing pad and the polishing solution do not comprise an abrasive.

6. The single-crystal silicon-carbide substrate according to claim 5, wherein a pH of the polishing solution is 11 or less.

7. The single-crystal silicon-carbide substrate according to claim 5, wherein a pH of the polishing solution is 5 or less.

8. The single-crystal silicon-carbide substrate according to claim 5, wherein a pH of the polishing solution is 3 or less.

9. The single-crystal silicon-carbide substrate according to claim 5, wherein the oxidizing agent comprises a permanganate ion.

10. The single-crystal silicon-carbide substrate according to claim 5, wherein the oxidizing agent comprises potassium permanganate or sodium permanganate.

11. The single-crystal silicon-carbide substrate according to claim 9, wherein an amount of the permanganate ion in the polishing solution is 0.05 mass % or more and 5 mass % or less.

12. The single-crystal silicon-carbide substrate according to claim 9, wherein an amount of the permanganate ion in the polishing solution is 0.1 mass % or more and 4 mass % or less.

13. The single-crystal silicon-carbide substrate according to claim 9, wherein an amount of the permanganate ion in the polishing solution is 0.2 mass % or more and 3.5 mass % or less.

14. The single-crystal silicon-carbide substrate according to claim 1, wherein the single-crystal silicon-carbide substrate is an on-axis substrate.

15. The single-crystal silicon-carbide substrate according to claim 1, wherein the single-crystal silicon-carbide substrate is an on-axis 4H—SiC substrate.

* * * * *